(12) United States Patent
Yang et al.

(10) Patent No.: US 8,420,531 B2
(45) Date of Patent: Apr. 16, 2013

(54) ENHANCED DIFFUSION BARRIER FOR INTERCONNECT STRUCTURES

(75) Inventors: Chih-Chao Yang, Glenmont, NY (US); Daniel C. Edelstein, White Plains, NY (US); Steven E. Molis, Patterson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/164,929

(22) Filed: Jun. 21, 2011

(65) Prior Publication Data
US 2012/0326311 A1 Dec. 27, 2012

(51) Int. Cl.
*H01L 21/4763* (2006.01)
(52) U.S. Cl.
USPC ............ 438/643; 438/627; 257/E21.584
(58) Field of Classification Search ............ 438/627, 438/629, 637, 642, 643
See application file for complete search history.

(56) References Cited

U.S. PATENT DOCUMENTS

| | | |
|---|---|---|
| 5,393,702 A | 2/1995 | Yang et al. |
| 6,174,812 B1 | 1/2001 | Hsiung et al. |
| 6,191,023 B1 | 2/2001 | Chen |
| 6,204,204 B1 | 3/2001 | Paranjpe et al. |
| 6,251,806 B1 | 6/2001 | Chang et al. |
| 6,303,459 B1 | 10/2001 | Chen |
| 6,342,448 B1 | 1/2002 | Lin et al. |
| 6,350,667 B1 | 2/2002 | Chen et al. |
| 6,437,440 B1 | 8/2002 | Cabral, Jr. et al. |
| 6,475,902 B1 | 11/2002 | Hausmann et al. |
| 6,491,978 B1 | 12/2002 | Kalyanam |
| 6,518,203 B2 * | 2/2003 | Narwankar et al. ........... 438/776 |
| 6,528,180 B1 | 3/2003 | Lee et al. |
| 6,680,538 B2 | 1/2004 | Kim et al. |
| 6,736,701 B1 | 5/2004 | Shue et al. |
| 6,783,868 B2 | 8/2004 | Ciotti et al. |
| 6,900,539 B2 | 5/2005 | Motoyama |
| 6,909,188 B2 | 6/2005 | Akiyama |

(Continued)

OTHER PUBLICATIONS

Wilks, J.A., et al., "Nitridation of organo-silicate glass: A self-limiting process for PVD Ta1+xN/Ta barrier formation", Applied Surface Science, 2009, 255, pp. 9543-9547.

*Primary Examiner* — Charles Garber
*Assistant Examiner* — Reema Patel
(74) *Attorney, Agent, or Firm* — Scully, Scott, Murphy & Presser, P.C.; Parashos Kalaitzis, Esq.

(57) ABSTRACT

Alternative methods of fabricating an interconnect structure in which an enhanced diffusion barrier including an in-situ formed metal nitride liner formed between an interconnect dielectric material and an overlying metal diffusion barrier liner are provided. In one embodiment, the method includes forming at least one opening into an interconnect dielectric material. A nitrogen enriched dielectric surface layer is formed within exposed surfaces of the interconnect dielectric material utilizing thermal nitridation. A metal diffusion barrier liner is formed on the nitrogen enriched dielectric surface. During and/or after the formation of the metal diffusion barrier liner, a metal nitride liner forms in-situ in a lower region of the metal diffusion barrier liner. A conductive material is then formed on the metal diffusion barrier liner. The conductive material, the metal diffusion barrier liner and the metal nitride liner that are located outside of the at least one opening are removed to provide a planarized conductive material, a planarized metal diffusion barrier liner and a planarized metal nitride liner, each of which includes an upper surface that is co-planar with the nitrogen enriched dielectric surface layer of the interconnect dielectric material.

20 Claims, 5 Drawing Sheets

U.S. PATENT DOCUMENTS

| | | |
|---|---|---|
| 6,910,947 B2 | 6/2005 | Paik |
| 6,913,938 B2 | 7/2005 | Shanmugasundram et al. |
| 6,919,636 B1 | 7/2005 | Ryan |
| 6,936,843 B2 | 8/2005 | Cui |
| 6,950,716 B2 | 9/2005 | Ward et al. |
| 6,952,052 B1 | 10/2005 | Marathe et al. |
| 6,961,626 B1 | 11/2005 | Paik |
| 6,984,198 B2 | 1/2006 | Krishnamurthy et al. |
| 6,999,836 B2 | 2/2006 | Schwarm et al. |
| 7,026,721 B2 | 4/2006 | Chen |
| 7,040,956 B2 | 5/2006 | Paik |
| 7,069,101 B1 | 6/2006 | Arackaparambil et al. |
| 7,078,810 B2 | 7/2006 | Wang et al. |
| 7,082,345 B2 | 7/2006 | Shanmugasundram et al. |
| 7,096,085 B2 | 8/2006 | Paik |
| 7,101,799 B2 | 9/2006 | Paik |
| 7,151,315 B2 | 12/2006 | Wu et al. |
| 7,160,739 B2 | 1/2007 | Shanmugasundram et al. |
| 7,174,230 B2 | 2/2007 | Arackaparambil et al. |
| 7,188,142 B2 | 3/2007 | Chi et al. |
| 7,199,020 B2 | 4/2007 | Mehrotra et al. |
| 7,201,936 B2 | 4/2007 | Schwarm et al. |
| 7,205,228 B2 | 4/2007 | Padhi et al. |
| 7,221,990 B2 | 5/2007 | Paik |
| 7,225,047 B2 | 5/2007 | Al-Bayati et al. |
| 7,272,459 B2 | 9/2007 | Kokotov et al. |
| 7,333,871 B2 | 2/2008 | Schwarm |
| 7,337,019 B2 | 2/2008 | Reiss et al. |
| 7,349,753 B2 | 3/2008 | Paik |
| 7,354,332 B2 | 4/2008 | Surana et al. |
| 7,356,377 B2 | 4/2008 | Schwarm |
| 7,358,589 B1 | 4/2008 | Hawley et al. |
| 7,390,726 B1 | 6/2008 | Issaq et al. |
| 7,393,722 B1 | 7/2008 | Issaq et al. |
| 7,405,151 B2 | 7/2008 | Wang et al. |
| 7,459,763 B1 | 12/2008 | Issaq et al. |
| 7,531,403 B2 | 5/2009 | Icel et al. |
| 7,611,912 B2 | 11/2009 | Hong et al. |
| 7,666,788 B2 | 2/2010 | Sinha |
| 7,698,012 B2 | 4/2010 | Shanmugasundram et al. |
| 7,700,474 B2 | 4/2010 | Cerio, Jr. |
| 7,772,115 B2 | 8/2010 | Hiatt |
| 7,833,894 B2 | 11/2010 | Hiatt |
| 2005/0121786 A1* | 6/2005 | Furuya et al. .................. 257/751 |
| 2007/0152333 A1* | 7/2007 | Lee ................................ 257/751 |

* cited by examiner

ENHANCED DIFFUSION BARRIER FOR INTERCONNECT STRUCTURES

BACKGROUND

The present disclosure relates to a semiconductor structure and a method of fabricating the same. More particularly, the present disclosure relates to an interconnect structure including an enhanced diffusion barrier in which a metal nitride liner component of the diffusion barrier is formed in-situ. The present disclosure also provides methods of forming such an interconnect structure.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, or a Cu alloy since Cu-based interconnects provide higher speed signal transmission between large numbers of transistors on a complex semiconductor chip as compared with aluminum, Al,-based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") can be achieved in today's IC product chips by embedding the metal lines and metal vias (e.g., conductive features) in an interconnect dielectric material having a dielectric constant of less than 4.0.

In a typical interconnect structure, a first diffusion barrier composed of TaN and a second diffusion barrier composed of Ta are sequentially deposited utilizing physical vapor deposition (PVD) within an opening that is formed into the interconnect dielectric material. The utilizing of two deposition steps in forming the TaN/Ta diffusion barrier adds costs and additional complexity in fabricating interconnect structures.

SUMMARY

The present disclosure provides alternative methods of fabricating an interconnect structure in which an efficient diffusion barrier including a metal nitride liner is formed via a single metal deposition on a nitrogen enriched dielectric surface. The metal nitride liner is formed in-situ in a lower region of the metal diffusion barrier. The present disclosure also provides alternative methods of fabricating an interconnect structure in which an enhanced diffusion barrier including a metal nitride liner is formed via deposition of a metal nitride/metal bilayer on a nitrogen enriched dielectric surface. An enhanced interfacial property between the metal nitride liner and the nitrogen enriched dielectric surface is formed in-situ.

In one embodiment of the present disclosure, the method includes forming at least one opening into an interconnect dielectric material. A nitrogen enriched dielectric surface layer is formed within exposed surfaces of the interconnect dielectric material utilizing thermal nitridation. Since thermal nitridation is employed, the exposed surfaces of the interconnect dielectric material are not damaged. A metal diffusion barrier liner is formed on the nitrogen enriched dielectric surface layer. During and/or after the formation of the metal diffusion barrier liner, a metal nitride liner forms in a lower region of the metal diffusion barrier liner by reacting metal atoms from the metal diffusion barrier liner with nitrogen atoms present in the nitrogen enriched dielectric surface layer. A conductive material is then formed on the metal diffusion barrier liner. The conductive material, the metal diffusion barrier liner and the metal nitride liner that are located outside of the at least one opening are then removed to provide a planarized conductive material, a planarized metal diffusion barrier liner and a planarized metal nitride liner, each of which includes an upper surface that is co-planar with an upper surface of the nitrogen enriched dielectric surface layer of the interconnect dielectric material.

In another embodiment of the present disclosure, a method of forming an interconnect structure is provided that includes forming at least one opening into an interconnect dielectric material. A nitrogen enriched dielectric surface layer is formed within exposed surfaces of the interconnect dielectric material utilizing thermal nitridation. Since thermal nitridation is employed, no damage to the interconnect dielectric material is obtained. A metal nitride liner and a metal diffusion barrier liner are then formed on the nitrogen enriched dielectric surface layer. During and/or after the formation of at least the metal nitride liner, another metal nitride liner with a higher nitrogen content forms in a lower region of the metal nitride liner by reacting metal atoms from the metal nitride liner with nitrogen atoms from the nitrogen enriched dielectric surface layer. A conductive material is then formed on the metal diffusion barrier liner. After forming the conductive material, the conductive material, the metal diffusion barrier liner, the metal nitride liner and the another metal nitride liner that are located outside of the at least one opening are removed to provide a planarized conductive material, a planarized metal diffusion barrier liner, a planarized metal nitride layer and another planarized metal nitride layer, each of which includes an upper surface that is co-planar with an upper surface of the nitrogen enriched dielectric surface layer of the interconnect dielectric material.

The present disclosure also provides an interconnect structure. The disclosed interconnect structure includes an interconnect dielectric material comprising at least one opening located therein, wherein the interconnect dielectric material has undamaged exposed surfaces. The disclosed interconnect structure further includes a conductive material located within the at least one opening, the conductive material is separated from the interconnect dielectric material by a diffusion barrier comprising at least an in-situ formed metal nitride liner and an overlying metal diffusion barrier liner.

DETAILED DESCRIPTION

The present disclosure, which provides an interconnect structure having an enhanced diffusion barrier including a metal nitride liner formed in-situ in a lower region of a metal diffusion barrier liner and methods of fabricating the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
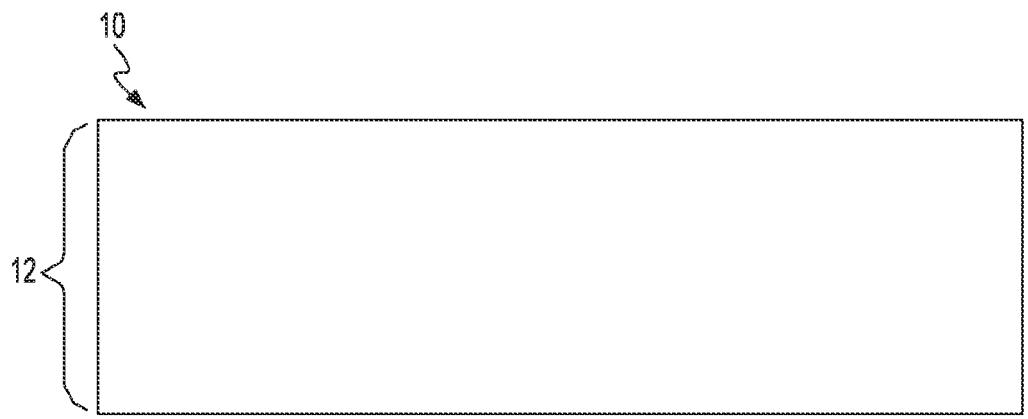
FIG. 1 is a pictorial representation (through a cross sectional view) illustrating an initial structure including an interconnect dielectric material that can be employed in one embodiment of the present disclosure.

Reference is now made to FIGS. 1-5B which illustrate the basic processing steps that are employed in one embodiment of the present disclosure. Specifically, FIG. 1 illustrates an initial structure 10 that comprises an interconnect dielectric material 12.

The interconnect dielectric material 12 may be located upon a substrate (not shown in the drawings of the present application). The substrate, which is not shown, may comprise a semiconducting material, an insulating material, a conductive material or any combination thereof. When the substrate is comprised of a semiconducting material, any material having semiconductor properties such as, for example, Si, SiGe, SiGeC, SiC, Ge alloys, GaAs, InAs, InP and other III/V or II/VI compound semiconductors, may be used. In addition to these listed types of semiconducting materials, the substrate that is located beneath the interconnect dielectric material 12 can be a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or any combination thereof including multilayers. When the substrate comprises a semiconducting material, one or more semiconductor devices such as, for example, complementary metal oxide semiconductor (CMOS) devices can be fabricated thereon. When the substrate comprises a combination of an insulating material and a conductive material, the substrate may represent an underlying interconnect level of a multilayered interconnect structure.

The interconnect dielectric material 12 that is employed in the present disclosure may comprise any interlevel or intralevel dielectric including inorganic dielectrics or organic dielectrics. In one embodiment, the interconnect dielectric material 12 may be non-porous. In another embodiment, the interconnect dielectric material 12 may be porous. Some examples of suitable dielectrics that can be used as the interconnect dielectric material 12 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The interconnect dielectric material 12 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the interconnect dielectric material 12 may vary depending upon the type of interconnect dielectric material used as well as the exact number of dielectrics layers within the interconnect dielectric material 12. Typically, and for normal interconnect structures, the interconnect dielectric material 12 has a thickness from 50 nm to 1000 nm.

In some embodiments, not shown, a hard mask can be formed on an upper surface of the interconnect dielectric material 12. When present, the hard mask can include an oxide, a nitride, an oxynitride or any multilayered combination thereof. In one embodiment, the hard mask is an oxide such as silicon dioxide, while in another embodiment the hard mask is a nitride such as silicon nitride.

The hard mask is formed utilizing a conventional deposition process including, for example, chemical vapor deposition (CVD), plasma enhanced chemical vapor deposition (PECVD), chemical solution deposition, evaporation, and physical vapor deposition (PVD). Alternatively, the hard mask may be formed by one of thermal oxidation, and thermal nitridation.

The thickness of the hard mask employed in the present disclosure may vary depending on the material of the hard mask itself as well as the techniques used in forming the same. Typically, the hard mask has a thickness from 5 nm to 100 nm, with a thickness from 10 nm to 80 nm being even more typical.

Figure 2:
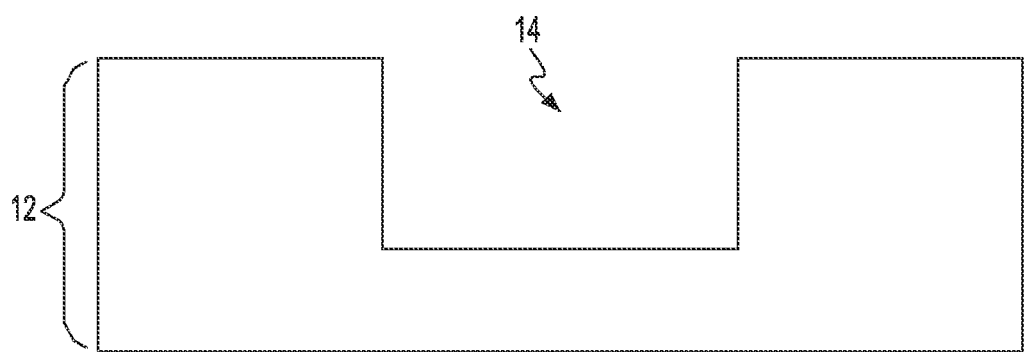
FIG. 2 is a pictorial representation (through a cross sectional view) illustrating the initial structure of FIG. 1 after forming at least one opening into the interconnect dielectric material.

Next, and as shown in FIG. 2, at least one opening 14 is formed into the hard mask, if present, and into the interconnect dielectric material 12 utilizing lithography and etching. When a hard mask is not present, the at least one opening 14 is formed only into the interconnect dielectric material 12. The lithographic process includes forming a photoresist (not shown) directly on the hard mask, if present, or directly on the interconnect dielectric material 12, if the hard mask is not present, exposing the photoresist to a desired pattern of radiation and developing the exposed photoresist utilizing a conventional resist developer. The etching process includes a dry etching process (such as, for example, reactive ion etching, ion beam etching, plasma etching or laser ablation), and/or a wet chemical etching process. Typically, reactive ion etching is used in providing the at least one opening 14 into at least the interconnect dielectric material 12. In some embodiments, the etching process includes a first pattern transfer step in which the pattern provided to the photoresist is transferred to the hard mask, the patterned photoresist is then removed by an ashing step, and thereafter, a second pattern transfer step is used to transfer the pattern from the patterned hard mask into the underlying interconnect dielectric material 12.

The depth of the at least one opening 14 that is formed into the interconnect dielectric material 12 (measured from the upper surface of the interconnect dielectric material 12 to the bottom wall of the at least one opening 14) may vary. In some embodiments, the at least one opening 14 may extend entirely through the interconnect dielectric material 12. In yet other embodiments, the at least one opening 14 stops within the interconnect dielectric material 12 itself. In yet further embodiments, different depth openings can be formed into the interconnect dielectric material 12.

The at least one opening 14 that is formed may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. In FIG. 2, and by way of an example, the at least one opening 14 is shown as a line opening. It is noted that although the drawings illustrate a single opening, the present disclosure is not limited to forming only one opening into the interconnect dielectric material 12. Instead, a plurality of openings can be formed. When a plurality of openings is formed, each opening can be a line opening, a via opening, a combined via/line opening or any combination thereof.

When a via or line is formed, a single damascene process (including the above mentioned lithography and etching steps) can be employed. When a combined via/line is formed a dual damascene process (including at least one iteration of the above mentioned lithography and etching steps) can be employed.

In some embodiments, the hard mask that is formed atop the interconnect dielectric material 12 can be removed from the structure after the interconnect dielectric material 12 has been patterned to include the at least one opening 14. The removal of the hard mask, which is also patterned, can be achieved by utilizing a conventional planarization process such as, for example, chemical mechanical planarization (CMP). In some other embodiments, the patterned hard mask can remain on the upper horizontal surface of the interconnect dielectric material 12 and the patterned hard mask is then removed during a subsequent planarization step.

Figure 3:
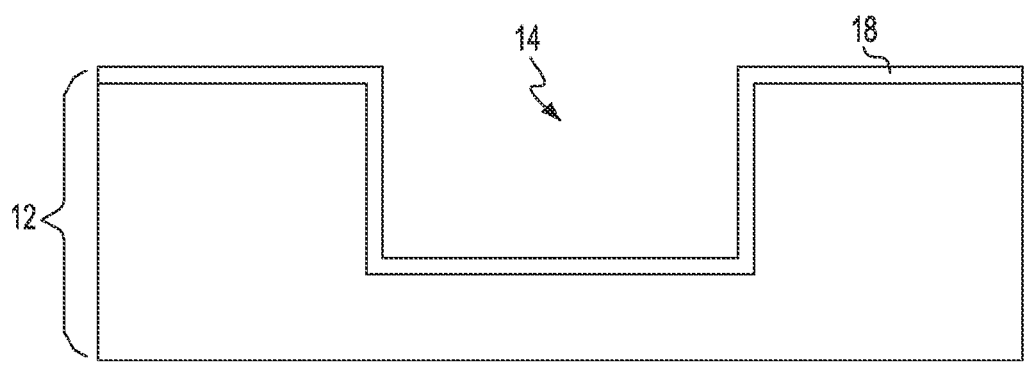
FIG. 3 is a pictorial representation (through a cross sectional view) illustrating the structure of FIG. 2 after performing a thermal nitridation process in which a nitrogen enriched dielectric surface layer, e.g., thermal nitrided surface, is formed within all exposed surfaces of the interconnect dielectric material.

Referring to FIG. 3, there is illustrated the structure of FIG. 2 after performing a thermal nitridation process in which a nitrogen enriched dielectric surface layer 18 is formed within all exposed surfaces of the interconnect dielectric material 12 including within the at least one opening 14 and atop the horizontal surface of the interconnect dielectric material. By "nitrogen enriched dielectric surface layer" it is meant that the exposed surfaces of the interconnect dielectric material 12 have a higher nitrogen content therein after performing the thermal nitridation process as compared to the original interconnect dielectric material. The nitrogen enriched dielectric surface layer 18 may also be referred to as a nitrided surface.

As stated above, the nitrogen enriched dielectric surface layer 18 is formed by subjecting the structure shown in FIG. 2 to a thermal nitridation process. The thermal nitridation process employed in the present disclosure does not cause any damage to the interconnect dielectric material 12 or to the profile of the at least one opening 14. That is, the thermal process that is employed in the present disclosure does not include an electrical bias higher than 200 W. In some embodiments, no electrical bias is performed during the thermal process. This is unlike a conventional plasma process which involves an electrical bias higher than 350 W, and causes dielectric and/or profile damage. Damage to the dielectric material and/or profile of the at least one opening typically results in an interconnect structure having a low short yield, a low line resistance and an increased capacitance.

The thermal nitridation process employed in the present disclosure is performed in any nitrogen-containing ambient, which is not in the form of a plasma. The nitrogen-containing ambients that can be employed in the present disclosure include, but are not limited to, $N_2$, $NH_3$, $NH_4$, NO, and $NH_x$ wherein x is between 0 and 1. Mixtures of the aforementioned nitrogen-containing ambients can also be employed in the present disclosure. In some embodiments, the nitrogen-containing ambient is used neat, i.e., non-diluted. In other embodiments, the nitrogen-containing ambient can be diluted with an inert gas such as, for example, He, Ne, Ar and mixtures thereof. In some embodiments, $H_2$ can be used to dilute the nitrogen-containing ambient. Notwithstanding whether the nitrogen-containing ambient is employed neat or diluted, the content of nitrogen within the nitrogen-containing ambient employed in the present disclosure is typically from 10% to 100%, with a nitrogen content within the nitrogen-containing ambient from 50% to 80% being more typical.

In one embodiment, the thermal nitridation process employed in the present disclosure is performed at a temperature from 50° C. to 450° C. In another embodiment, the thermal nitridation process employed in the present disclosure is performed at a temperature from 100° C. to 300° C.

The depth of the nitrogen enriched dielectric surface layer 18 may vary depending on the type of nitrogen-containing ambient employed and the temperature at which the thermal nitridation is performed. Typically, the depth of the nitrogen enriched dielectric surface layer 18, as measured from the outer most exposed surface of the interconnect dielectric material 12 inward, is from 0.5 nm to 20 nm, with a depth from 1 nm to 10 nm being more typical.

Figure 4A:
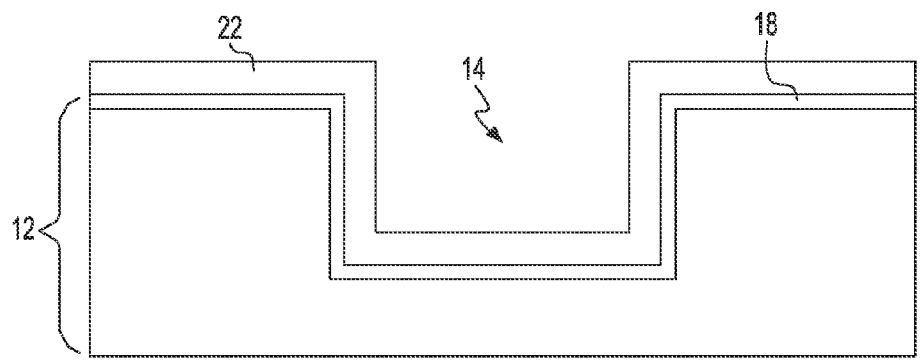
FIG. 4A is a pictorial representation (through a cross sectional view) illustrating the structure of FIG. 3 after forming a metal diffusion barrier liner on the nitrogen enriched dielectric surface layer.
Figure 4B:
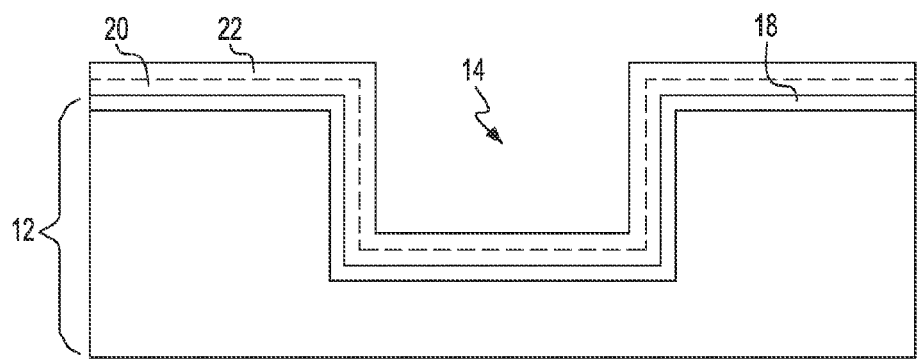
FIG. 4B is a pictorial representation (through a cross sectional view) illustrating the structure of FIG. 4A in which a metal nitride liner forms in-situ in a lower region of the metal diffusion barrier liner.

Referring now to FIG. 4A, there is illustrated the structure of FIG. 3 after forming a metal diffusion barrier liner 22 on the nitrogen enriched dielectric surface layer 18. FIG. 4B illustrates the structure of FIG. 4A after a metal nitride liner 20 forms in-situ by reaction of metal atoms from the metal diffusion barrier liner 22 with nitrogen atoms from the underlying nitrogen enriched dielectric surface layer 18. As shown, the metal nitride liner 20 forms in a lower portion of the metal diffusion barrier liner 22 (represented by the dotted lines in the drawings). As such, the metal nitride liner 20 is positioned between the nitrogen enriched dielectric surface layer 18 and the metal diffusion barrier liner 22. In one embodiment of the present disclosure, the in-situ formation of the metal nitride liner 20 occurs during the formation of the metal diffusion barrier liner 22. In another embodiment, the in-situ formation of the metal nitride 20 occurs after complete formation of the metal diffusion barrier liner 22. In yet another embodiment, in-situ formation of the metal nitride 20 occurs both during and after forming the metal diffusion barrier liner 22.

The metal diffusion barrier liner 22 that is formed at this point of the present disclosure includes, but is not limited to, Ta, Ti, Ru, RuTa, Co and W. In one embodiment, Ta is employed as the material for the metal diffusion barrier liner 22. The metal diffusion barrier liner 22 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

As mentioned above, a metal nitride liner 20 forms in-situ during and/or after the deposition of the metal diffusion barrier liner 22 by reacting nitrogen atoms from the nitrogen enriched dielectric surface layer 18 with the metallic atoms of the metal diffusion barrier liner 22. As such, a single barrier liner deposition forms a bilayer structure and improves the efficiency of the process.

Figure 8A:
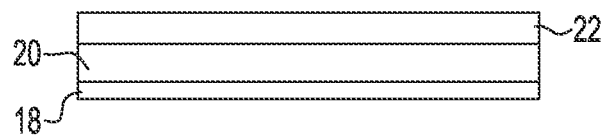
FIGS. 8A-8C are pictorial representations (through cross sectional views) depicting the various diffusion barriers including an in-situ formed metal nitride liner that can be formed in the present disclosure; in each of these drawings, the diffusion barrier is located atop a portion of a nitrogen enriched dielectric surface layer formed within an interconnect dielectric material.
Figure 8B:
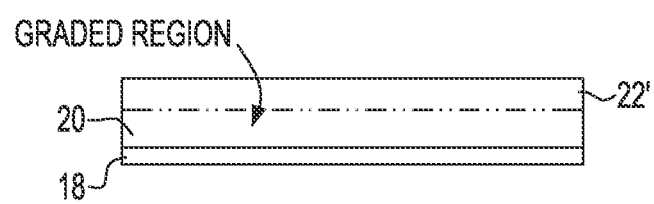

In some embodiments of the present disclosure, a bilayer containing the metal nitride liner 20 and the metal diffusion barrier liner 22 is formed. The bilayer diffusion barrier has a distinct interface between the metal nitride liner 20 and the metal diffusion barrier liner 22. This is shown in FIG. 4B, as a well as, in FIG. 8A. In another embodiment, and as shown in FIG. 8B, a gradient diffusion barrier layer is formed in which the content of nitrogen within the structure decreases upward from the nitrogen enriched dielectric surface layer 18 of the interconnect dielectric material 12.

The thickness of the metal diffusion barrier liner 22 may vary depending on the deposition process used as well as the material employed. Typically, the metal diffusion barrier liner 22 has a thickness from 2 nm to 50 nm, with a thickness from 5 nm to 20 nm being more typical. The thickness of the metal nitride liner 20 may also vary. Typically, the metal nitride liner 20 has a thickness from 0.5 nm to 20 nm, with a thickness from 1 nm to 10 nm being more typical. It is observed that both the diffusion barrier liner 22 and the metal nitride liner 20 are continuously present, i.e., without no apparent breaks in the liners, in at least the at least one opening 14 of the structure. In embodiments, in which a patterned hard mask is present atop the interconnect dielectric material, the nitrogen enriched dielectric surface layer 18, and the subsequent formation of the metal nitride liner 20 occur only within the at least one opening 14.

In some embodiments, an optional plating seed layer (not specifically shown in the drawings of the present application) can be formed on the surface of the metal diffusion barrier liner 22. The optional plating seed layer can be employed to selectively promote subsequent electroplating of a pre-selected conductive metal or metal alloy. The optional plating seed layer may comprise Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening 14.

The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, and PVD.

Figure 5A:
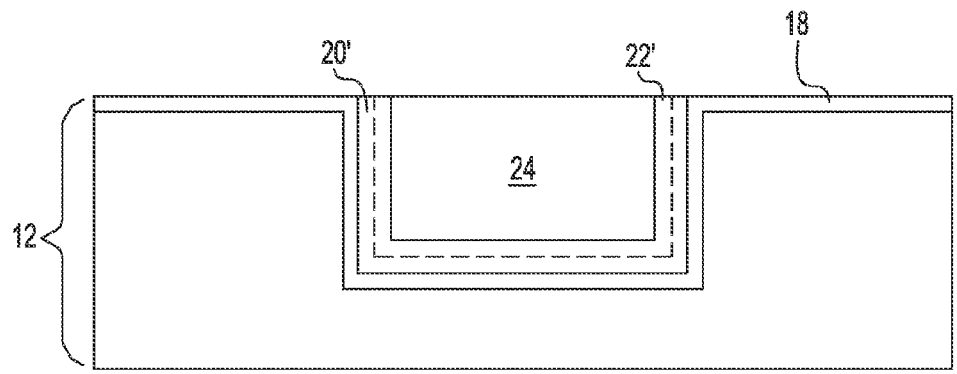
FIG. 5A is a pictorial representation (through a cross sectional view) illustrating the structure of FIG. 4B after forming a conductive material and planarizing the structure, stopping atop an upper surface of the nitrogen enriched dielectric surface layer.
Figure 5B:
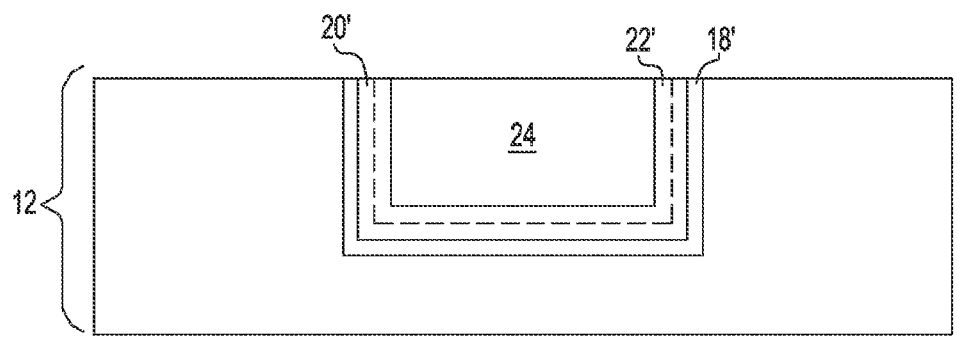
FIG. 5B is a pictorial representation (through a cross sectional view) illustrating the structure of FIG. 4B after forming a conductive material and planarizing the structure, stopping atop an upper surface of the interconnect dielectric material.

Referring now to FIGS. 5A-5B, there are illustrated the structure of FIG. 4B after forming a conductive material and planarizing the structure. In FIGS. 5A-5B, reference numeral 24 denotes the planarized conductive material, reference numeral 22' denotes the planarized metal diffusion barrier liner which is now U-shaped, and reference numeral 20' denotes the planarized metal nitride liner which is also now U-shaped. As shown in the embodiment of FIG. 5A, each of layers 24, 22' and 20' has an upper surface that is co-planar with the nitrogen enriched dielectric surface layer 18 of the interconnect dielectric material 12. FIG. 5B shows an embodiment in which each of layers 24, 22', 20' and 18' (i.e., an U-shaped nitrogen enriched dielectric surface that is confined to the sidewalls of the interconnect dielectric material 12) has an upper surface that is co-planar with an upper surface of the interconnect dielectric material 12.

The structure shown in FIG. 5A or FIG. 5B is formed by first depositing a conductive material atop the metal diffusion barrier liner 22. The conductive material completely fills the remaining portions of the at least one opening 14 and extends above mouth of the at least one opening 14 onto the nitrogen enriched dielectric surface layer 18 of the dielectric material 12 as well. The conductive material may comprise polySi, SiGe, a conductive metal, an alloy comprising at least one conductive metal, a conductive metal silicide or combinations thereof. In one embodiment, the conductive material is a conductive metal such as Cu, W or Al. In another embodiment, the conductive material comprises Cu or a Cu alloy such as AlCu.

The conductive material may be formed by any conventional deposition process including chemical vapor deposition (CVD), plasma enhanced chemical vapor deposition (PECVD), sputtering, chemical solution deposition or plating that fills the at least one opening 14 from the bottom upwards can be used. In one embodiment of the present disclosure, the conductive material is formed utilizing a bottom-up plating process.

After depositing the conductive material, a planarization process such as, for example, chemical mechanical polishing (CMP) and/or grinding, is employed to remove portions of the conductive material, the metal diffusion barrier liner 22 and the metal nitride liner 20 that extend above the mouth of the at least one opening 14. In the embodiment shown in FIG. 5B, the planarization step also removes the nitrogen enriched dielectric surface layer 18 from atop the horizontal surface of the interconnect dielectric material 12. The planarization process provides the structure shown in FIG. 5A or FIG. 5B. In embodiments in which a patterned hard mask is present, the planarization process can also be used to remove the patterned hard mask from the structure.

Figure 6A:
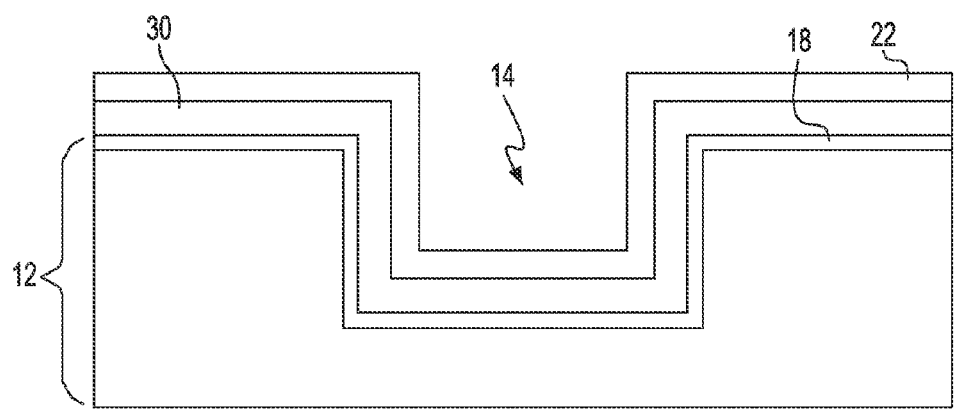
FIG. 6A is a pictorial representation (through a cross sectional view) illustrating the structure of FIG. 3 after forming a metal nitride liner and a metal diffusion barrier liner.
Figure 6B:
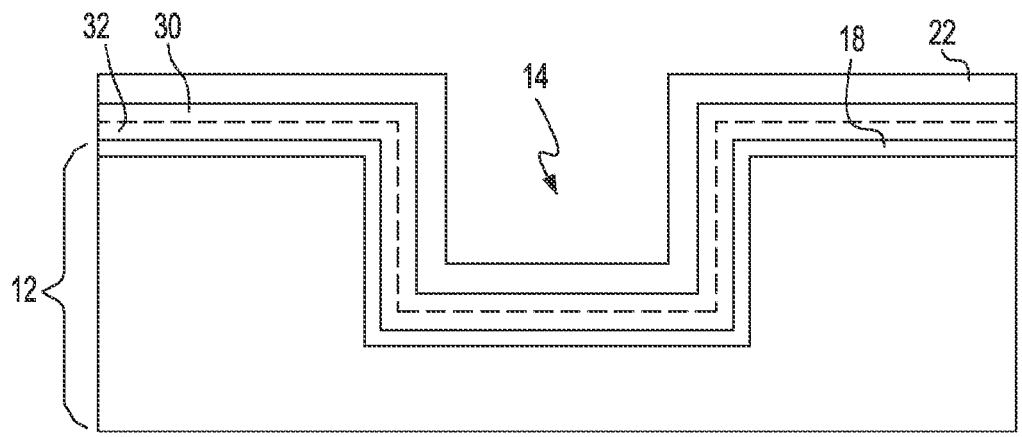
FIG. 6B is a pictorial representation (through a cross sectional view) of the structure of FIG. 6A in which another metal nitride liner forms in-situ in a lower region of the metal nitride liner.

Reference is now made to FIGS. 6A, 6B, 7A, 7C and 8C, which represent another embodiment of the present disclosure. In this embodiment, a graded trilayer diffusion barrier is formed. Specifically, this embodiment of the present disclosure begins by first providing the structure shown in FIG. 3. After forming the structure shown in FIG. 3, a metal nitride liner 30 and a metal diffusion barrier liner 22 are formed as shown in FIG. 6A. During and/or after the formation of metal nitride liner 30 and/or the metal diffusion barrier liner 22, another metal nitride liner 32 with a higher nitrogen content than that of the metal nitride liner 30 forms in-situ. Such a structure is shown in FIG. 6B. In this embodiment, the another metal nitride liner 32 forms within a lower portion of the metal nitride liner 30.

The metal nitride liner 30 that is formed in this embodiment of the present disclosure includes, but is not limited to, TaN, TiN, RuN, CoN and TaRuN. In one embodiment, the metal nitride liner 30 is composed of TaN. The metal nitride liner 30 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating. The metal nitride liner 30 that is formed typically has a thickness from 2 nm to 50 nm, with a thickness from 5 nm to 20 nm being more typical.

During and/or after the formation of the metal nitride liner 30, the another metal nitride liner 32 forms in-situ by reacting the metal atoms of the metal nitride liner 30 with the underlying nitrogen enriched dielectric surface layer 18. The another metal liner 32 formed in this embodiment includes the same materials and thickness as mentioned above for metal nitride liner 22.

After forming the metal nitride liner 30, the metal diffusion barrier liner 22 is formed atop the metal nitride liner 30. The metal diffusion barrier liner 22 is comprised of one of the materials mentioned above in the embodiment depicted in FIGS. 1-5B. Also, the metal diffusion barrier liner 22 can be formed utilizing one of the techniques mentioned above as well. In this embodiment, the metal diffusion barrier liner 22 can be comprised of the same or different metal as present within metal nitride liners 30 and 32.

The thickness of the another metal nitride liner 32 may vary. Typically, the another metal nitride liner 32 has a thickness from 0.5 to 20 nm, with a thickness from 1 to 10 nm being more typical. It is noted that the metal diffusion barrier liner 22, the metal nitride liner 30 and the another metal nitride liner 32 are continuously present, i.e., without no apparent breaks in the liners, in the structure.

The metal diffusion barrier liner 22, the metal nitride liner 30 and the another metal nitride liner 32 constitute a trilayer diffusion barrier of the present disclosure. This is more clearly seen in FIG. 8C. In this embodiment, the content of nitrogen within the metal nitride liner 30 and the another metal nitride liner 32 may be different such that a graded trilayer is formed. As stated above, the another metal nitride liner 32 has a higher nitrogen content than the metal nitride liner 30.

Figure 7A:
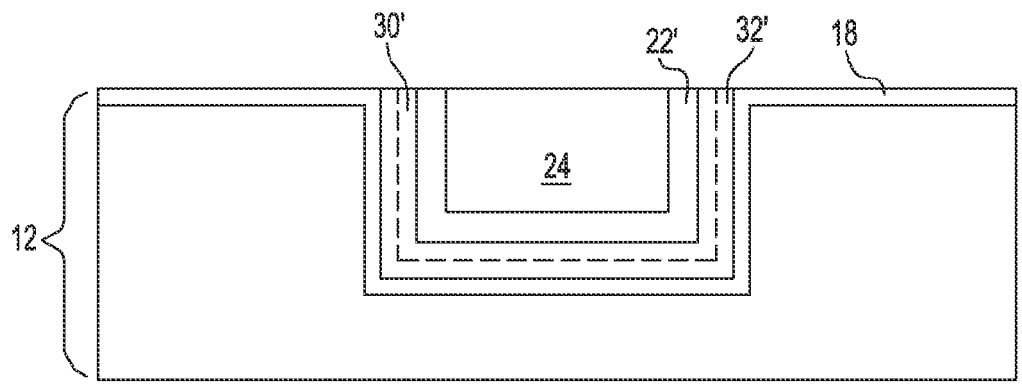
FIG. 7A is a pictorial representation (through a cross sectional view) illustrating the structure of FIG. 6B after forming a conductive material and planarizing the structure, stopping atop an upper surface of the nitrogen enriched dielectric surface layer.
Figure 7B:
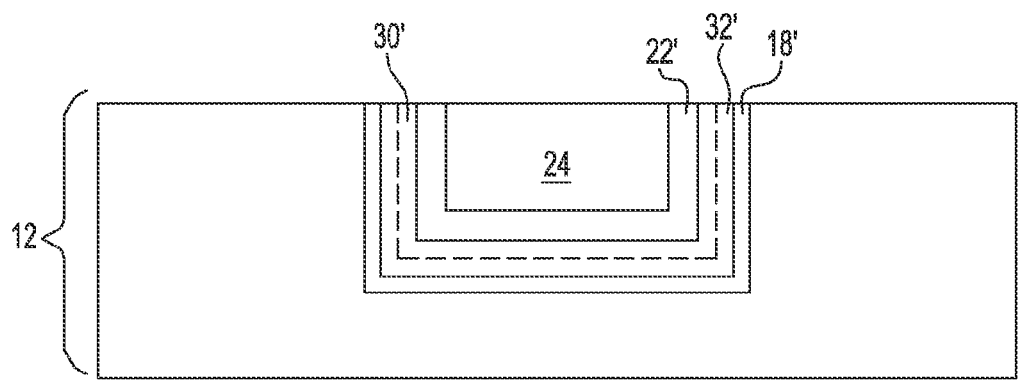
FIG. 7B is a pictorial representation (through a cross sectional view) illustrating the structure of FIG. 6B after forming a conductive material and planarizing the structure, stopping atop an upper surface of the interconnect dielectric material.

Referring now to FIGS. 7A-7B, there is illustrated the structure of FIG. 6B after forming a conductive material and planarizing the structure. In FIGS. 7A-7B, reference numeral 24 denotes the planarized conductive material, reference numeral 22' denotes the planarized metal diffusion barrier liner which is now U-shaped, reference numeral 30' denotes the planarized metal nitride liner which is also now U-shaped, and reference numeral 32' denotes the another metal nitride liner, which is also now U-shaped. As shown in FIG. 7A, each of layers 24, 22', 30' and 32' has an upper surface that is co-planar with the nitrogen enriched dielectric surface layer 18 of the interconnect dielectric material 12. FIG. 7B illustrates an embodiment in which each of layers 24, 22', 30', 32' and 18' (an U-shaped nitrogen enriched surface layer that remains in the at least one opening of the interconnect dielectric material 12) has an upper surface that is co-planar with an upper surface of the interconnect dielectric material 12.

Figure 8C:
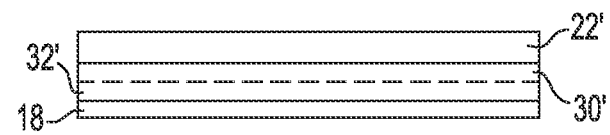

FIG. 8C illustrates a structure including a gradient diffusion barrier layer including layers 32', 30' and 22' in which the content of nitrogen within the structure decreases upward from the nitrogen enriched dielectric surface layer 18. Layer 32' has a higher nitrogen content than layer 30', and layer 30' has a higher nitrogen content than layer 22'.

The structure shown in FIG. 7A or FIG. 7B is formed as described in FIG. 5A and FIG. 5B above. Specifically, a conductive material is formed atop the metal diffusion barrier liner 22. The conductive material completely fills the remaining portions of the at least one opening 14 and extends above the mouth of the at least one opening 14. The conductive material may comprise polySi, SiGe, a conductive metal, an alloy comprising at least one conductive metal, a conductive metal silicide or combinations thereof. In one embodiment, the conductive material is a conductive metal such as Cu, W or Al. In another embodiment, the conductive material comprises Cu or a Cu alloy such as AlCu.

The conductive material may be formed by any conventional deposition process including chemical vapor deposition (CVD), plasma enhanced chemical vapor deposition (PECVD), sputtering, chemical solution deposition or plating that fills the at least one opening 14 from the bottom upwards can be used. In one embodiment of the present disclosure, the conductive material is formed utilizing a bottom-up plating process.

After depositing the conductive material, a planarization process such as, for example, chemical mechanical polishing (CMP) and/or grinding, is employed to remove portions of the conductive material, the metal diffusion barrier liner 22, the metal nitride 30 and the another metal nitride 32 that extend above the mouth of the at least one opening 14. The planarization process provides the structure shown in FIG. 7A. In the embodiment shown in FIG. 7B, the planarization step also removes the nitrogen enriched dielectric surface layer 18 from atop the horizontal surface of the interconnect dielectric material 12.

It is noted that in the various embodiments of the present disclosure, the nitrogen content within the nitrogen enriched dielectric surface layer 18 typically decreases after forming the in-situ metal nitride component of the diffusion barrier from its original value.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming an interconnect structure, said method comprising:

forming at least one opening into an interconnect dielectric material;

forming a nitrogen enriched dielectric surface layer within exposed surfaces of said interconnect dielectric material, wherein said nitrogen enriched dielectric surface layer is formed by thermal nitridation in a non-plasma nitrogen-containing ambient, said nitrogen enriched dielectric surface layer has a higher nitrogen content than a remaining portion of the interconnect dielectric material;

forming a metal diffusion barrier liner on said nitrogen enriched dielectric surface layer, wherein during and/or after said forming the metal diffusion barrier liner, a metal nitride liner forms in a lower region of the metal diffusion barrier liner by reacting metal atoms from said metal diffusion barrier liner with nitrogen atoms from said nitrogen enriched dielectric surface layer;

forming a conductive material on said metal diffusion barrier liner; and removing said conductive material, said metal diffusion barrier liner and said metal nitride liner that are located outside of the at least one opening to provide a planarized conductive material, a planarized metal diffusion barrier liner and a planarized metal nitride liner, each of which includes an upper surface that is co-planar with an upper surface of the nitrogen enriched dielectric surface layer of the interconnect dielectric material.

2. The method of claim 1, wherein said thermal nitridation does not cause any damage to the exposed surfaces of the interconnect dielectric material.

3. The method of claim 2, wherein said thermal nitridation is performed at a temperature from 50° C. to 450° C.

4. The method of claim 3, wherein said non-plasma nitrogen-containing ambient is selected from the group consisting of $N_2$, $NH_3$, $NH_4$, NO, and $NH_x$ wherein x is between 0-1.

5. The method of claim 4, wherein said non-plasma nitrogen-containing ambient has a nitrogen content of from 10% to 100%.

6. The method of claim 1, wherein said metal nitride liner has a graded nitrogen content.

7. The method of claim 1, wherein said nitrogen enriched dielectric surface is removed from an upper horizontal surface of the interconnect dielectric during said removing of said conductive material, said metal diffusion barrier liner and said metal nitride liner.

8. The method of claim 1, wherein said thermal nitridation is performed at an electrical bias of 200 W or less.

9. The method of claim 1, wherein said nitrogen enriched dielectric surface layer extends inward from said exposed surfaces to a depth of 0.5 nm to 20 nm.

10. The method of claim 1, wherein said another metal nitride liner is formed in-situ during the formation of the metal diffusion barrier liner.

11. The method of claim 1, wherein said another metal nitride liner is formed in-situ after the formation of the metal diffusion barrier liner.

12. A method of forming an interconnect structure, said method comprising:

forming at least one opening into an interconnect dielectric material;

forming a nitrogen enriched dielectric surface layer within exposed surfaces of said interconnect dielectric material, wherein said nitrogen enriched dielectric surface layer is formed by thermal nitridation in a non-plasma nitrogen-containing ambient, said nitrogen enriched dielectric surface layer has a higher nitrogen content than a remaining portion of the interconnect dielectric material;

forming a metal nitride liner and a metal diffusion barrier liner on said nitrogen enriched dielectric surface layer, wherein during and/or after said forming of the metal nitride liner, another metal nitride liner forms in a lower region of the metal nitride liner by reacting metal atoms from said metal nitride liner with nitrogen atoms of said nitrogen enriched dielectric surface layer;

forming a conductive material on said metal diffusion barrier liner; and removing said conductive material, said metal diffusion barrier liner, said metal nitride liner and said another metal nitride liner that are located outside of the at least one opening to provide a planarized conductive material, a planarized metal diffusion barrier liner, a planarized metal nitride layer and another planarized metal nitride liner, each of which includes an upper surface that is co-planar with an upper surface of the nitrogen enriched dielectric surface layer of the interconnect dielectric material.

13. The method of claim 12, wherein said thermal nitridation does not cause any damage to the exposed surfaces of the interconnect dielectric material.

14. The method of claim 13, wherein said thermal nitridation is performed at a temperature from 50° C. to 450° C.

15. The method of claim 14, wherein said non-plasma nitrogen-containing ambient is selected from the group consisting of $N_2$, $NH_3$, $NH_4$, NO, and $NH_x$ wherein x is between 0-1.

16. The method of claim 15, wherein said non-plasma nitrogen-containing ambient has a nitrogen content of from 10% to 100%.

17. The method of claim 12, wherein said another metal nitride liner contains a greater nitrogen content than the metal nitride liner.

18. The method of claim 12, wherein said nitrogen enriched dielectric surface is removed from an upper horizontal surface of the interconnect dielectric during said removing of said conductive material, said metal diffusion barrier liner, said metal nitride liner and said another metal nitride liner.

19. The method of claim 12, wherein said thermal nitridation is performed at an electrical bias of 200 W or less.

20. The method of claim 12, wherein said nitrogen enriched dielectric surface layer extends inward from said exposed surfaces to a depth of 0.5 nm to 20 nm.

* * * * *